US012765278B2

(12) United States Patent
Zota et al.

(10) Patent No.: US 12,765,278 B2
(45) Date of Patent: Oct. 13, 2026

(54) COUPLED QUANTUM DOTS WITH SELF-ALIGNED GATES

(71) Applicant: International Business Machines Corporation, Armonk, NY (US)

(72) Inventors: Bogdan Cezar Zota, Rueschlikon (CH); Kirsten Emilie Moselund, Rueschlikon (CH); Peter Mueller, Zurich (CH)

(73) Assignee: International Business Machines Corporation, Armonk, NY (US)

(*) Notice: Subject to any disclaimer, the term of this patent is extended or adjusted under 35 U.S.C. 154(b) by 89 days.

(21) Appl. No.: 18/063,969

(22) Filed: Dec. 9, 2022

(65) Prior Publication Data

US 2024/0196767 A1 Jun. 13, 2024

(51) Int. Cl.
*H10N 99/00* (2023.01)

(52) U.S. Cl.
CPC .................................... *H10N 99/05* (2023.02)

(58) Field of Classification Search
CPC ............. H10D 48/3835; H10D 30/014; H10D 30/402; H10D 48/383; H10D 30/024; H10D 30/62; H10D 48/385; H10D 62/812; H10D 64/017; H10D 64/27; H10D 84/0135; H10D 84/0149; H10D 84/0158; H10D 84/0193; H10D 84/038; H10D 84/834; H10N 99/05; H10F 77/146; H10P 30/22
See application file for complete search history.

(56) References Cited

U.S. PATENT DOCUMENTS

| | | | | |
|---|---|---|---|---|
| 8,507,894 | B2 * | 8/2013 | Morello | B82Y 10/00 257/411 |
| 10,929,769 | B2 * | 2/2021 | Pioro-Ladriere | H10D 64/27 |
| 11,171,237 | B2 * | 11/2021 | Shen | H10D 30/024 |

(Continued)

FOREIGN PATENT DOCUMENTS

| | | | |
|---|---|---|---|
| EP | 4030486 | A1 | 7/2022 |
| WO | 2006/083112 | A1 | 8/2006 |
| WO | 2024/023397 | A1 | 2/2024 |

OTHER PUBLICATIONS

Chatterjee et al., "Semiconductor qubits in practice," Nature Reviews | Physics, vol. 3, Mar. 2021, pp. 157-177.

(Continued)

*Primary Examiner* — Jaehwan Oh
(74) *Attorney, Agent, or Firm* — Joseph P. Curcuru

(57) ABSTRACT

A method for forming a semiconductor structure comprising quantum dots with self-aligned gate structures is disclosed. The method comprises structuring a doped silicon-on-isolator to build a source area, a linear structure extending from the source area having at least two distinct broadened areas, a first and a second gate structure simultaneously by a single lithography process; covering the structures with a blanket oxide layer, forming an opening in the blanket oxide layer at a lateral end of the linear structure, etching back the linear structure and the at least two distinct broadened areas below the blanket oxide until the source area is reached, and filling the hollow template with a semiconductor material different to the silicon such that the at least two broadened areas build quantum dot areas.

10 Claims, 7 Drawing Sheets

(56) References Cited

U.S. PATENT DOCUMENTS

| | | | | |
|---|---|---|---|---|
| 2004/0029050 | A1* | 2/2004 | Brenner | B82Y 10/00 438/525 |
| 2013/0221330 | A1* | 8/2013 | Choi | H10D 48/383 438/151 |
| 2017/0317203 | A1 | 11/2017 | Petta | |
| 2017/0365660 | A1 | 12/2017 | Borg | |
| 2019/0123183 | A1 | 4/2019 | Hutin | |
| 2019/0393330 | A1 | 12/2019 | Leipold | |
| 2021/0130944 | A1 | 5/2021 | Holmes et al. | |

OTHER PUBLICATIONS

Dais. C., "Templated Self-Assembly of SiGe Quantum Dots," Dissertation, Aug. 2009, 127 pages. <https://www.researchgate.net/publication/27560927_Templated_self-assembly_of_SiGe_quantum_dots>.

Eenink et al., "Tunable Coupling and Isolation of Single Electrons in Silicon Metal-Oxide-Semiconductor Quantum Dots," Nano Letters, 2019, pp. 8653-8657. <https://pubs.acs.org/doi/10.1021/acs.nanolett.9b03254>.

Geyer et al., "Silicon Quantum Dot Devices with a Self-Aligned Second Gate Layer," arXiv:2007.15400v1, Jul. 2020, pp. 1-9.

Ha et al., "A Flexible Design Platform for Si/SiGe Exchange-Only Qubits with Low Disorder," arXiv:2107.10916v1, Jul. 2021, 11 pages.

Maurand et al. "A CMOS silicon spin qubit," Nature Communications, 2016, pp. 1-6. DOI: 10.1038/ncomms13575.

Schmid et al., "Template-assisted selective epitaxy of III-V nanoscale devices for co-planar heterogeneous Integration with Si," Applied Physics Letters, 106, 233101-1-233101-5. <https://aip.scitation.org/doi/10.1063/1.4921962>.

Vinet et al., "Towards scalable silicon quantum computing," 2018 IEEE International Electron Devices Meeting (IEDM), Dec. 2018, 4 pages. <https://ieeexplore.ieee.org/document/8614675>.

Zota et al., "Lateral Heterostructure Isolated Coupled Quantum Dots," U.S. Appl. No. 18/063,950, filed Dec. 9, 2022.

List of IBM Patents or Patent Applications Treated as Related, filed herewith, 2 pages.

* cited by examiner

500

COUPLED QUANTUM DOTS WITH SELF-ALIGNED GATES

BACKGROUND

The invention relates generally to a method for forming quantum dots, and more specifically, to a method for forming a semiconductor structure comprising quantum dots with self-aligned gate structures. The invention relates further to a structured semiconductor device comprising quantum dots with self-aligned gate structures defining a physical qubit.

Quantum computing remains one of the hottest topics in physical science, the industry and in research. Classical digital computers and/or processors are slowly reaching their physical limitations, so research is looking for new ways to address mathematical and other problems that cannot be solved by classic von-Neumann machines due to the physical limitations in terms of structure size, power consumption and ultimately speed of processing.

Quantum computing is thus one of the promising areas to reach quantum supremacy, i.e., a real advantage in addressing very complex computation or tasks in reasonable times. As is well known, conventional computers encode process information in bits, i.e., “1”s and “0”s. Quantum computers, on the other hand, are based on so-called qubits which operate according to two key principles of quantum physics: superposition and entanglement. Superposition describes a situation that each qubit can represent both, a 1 and a 0 inference between possible outcomes for an event. Entanglement means that qubits in superposition can be correlated with each other in a non-classical way, i.e., the state of one qubit, whether it is a 1 or a 0 or both, can depend on the state of another, and that there is more information contained in qubits when they are entangled compared to single ones.

In general, a quantum state is the mathematical description of the state of an atomic or subatomic-size system. This is described as a vector in a vector space over complex numbers, popularly known as the Hilbert space. A quantum state can thereby describe any properties of the quantum particle or system of quantum particles, e.g., that position, momentum, quintessential phenomenon like quantum spins, and so on. Some of these properties are continuous variables and are therefore represented by vectors in the infinite-dimensional Hilbert space; position and momentum as variables are examples of this. However, other properties such as the spin of a particle can only assume definitive many quantized values and are therefore finished-dimensional. For example, the spin-part of the state of a quantum system with “n” electrons can be a state inside a 2n dimensional Hilbert space. Hence, the Hilbert space for “n” qubit quantum computer scales as 2n. Intuitively, each qubit in a quantum computer is not averse to a bit in the classical digital computer system. However, several qubits to gather in a system can explore a full “n”-dimensional Hilbert space instead of requiring 2nd classical bits to do the same. Hence, superposition and entanglement are two unique quantum properties that qubits possess over their classical counterparts.

SUMMARY

According to one aspect of the present invention, a method for forming a semiconductor structure comprising quantum dots with self-aligned gate structures may be provided. The system may comprise providing a silicon-on-isolator substrate comprising a doped silicon layer atop an isolator, and structuring the doped silicon layer to simultaneously form the following structures: a source area, a linear structure extending from the source area, where the linear structure may have a first width which may be smaller than a main area of the source area, and where the linear structure may comprise at least two distinct broadened areas. Thereby, the distinct broadened areas may have each a second width which may be larger than the first width of the linear structure. The structures may also comprise a first gate structure extending from a first one of the at least two distinct broadened areas, where the first gate structure may be physically separated from any of the distinct broadened areas, and a second gate structure extending from a second one of the at least two distinct broadened areas, where the first gate structure and the second gate structure may physically be separated from any of the distinct broadened areas, where elements of the structured doped silicon layer are formed by a single lithography process.

Additionally, the method may comprise covering the structures with a blanket oxide layer, forming an opening in the blanket oxide layer at a lateral end of the linear structure opposite to the source area, etching back semiconductor material of the linear structure and the at least two distinct broadened areas below the blanket oxide until the source area is reached, thereby forming a hollow template between the isolator and the blanket oxide layer, and filling the hollow template with a semiconductor material different to the silicon such that the at least two broadened areas build quantum dot areas.

According to another aspect of the present invention, a structured semiconductor device comprising quantum dots with self-aligned gate structures defining a physical qubit may be provided. The device may comprise a structured doped silicon layer over an isolator layer, the structured doped silicon layer comprising a source area, a linear structure extending from the source area, where the linear structure may have a first width which is smaller than a main area of the source area, and where the linear structure may comprise at least two distinct broadened areas, and where the distinct broadened areas have each a second width which is larger than the first width of the linear structure.

Furthermore, the device may comprise a first gate structure extending from a first one of the at least two distinct broadened areas, where the first gate structure may be physically separated from any of the distinct broadened areas, and a second gate structure extending from a second one of the at least two distinct broadened areas, where the second gate structure may be physically separated from any of the distinct broadened areas. Thereby, the linear structure with the broadened areas extending from the source area may comprise a semiconductor material different to the silicon such that the at least two broadened areas build quantum dot areas.

BRIEF DESCRIPTION OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, to which the invention is not limited.

Figure 1:
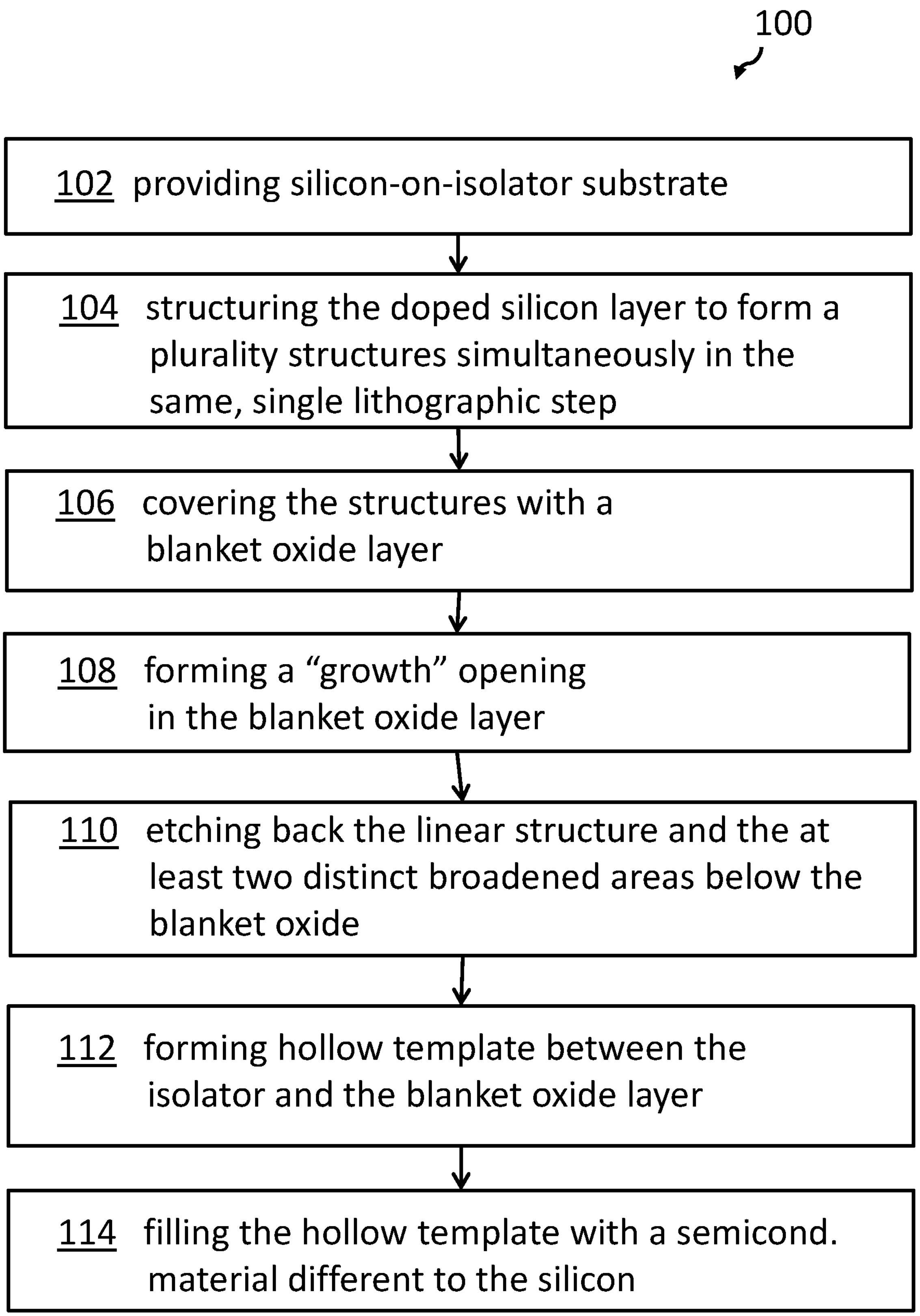

Preferred embodiments of the invention will be described, by way of example only, and with reference to the following drawings:

FIG. 1 shows a block diagram of an embodiment of the inventive method for forming a semiconductor structure comprising quantum dots with self-aligned gate structures, in accordance with an embodiment of the present invention.

Figure 2:
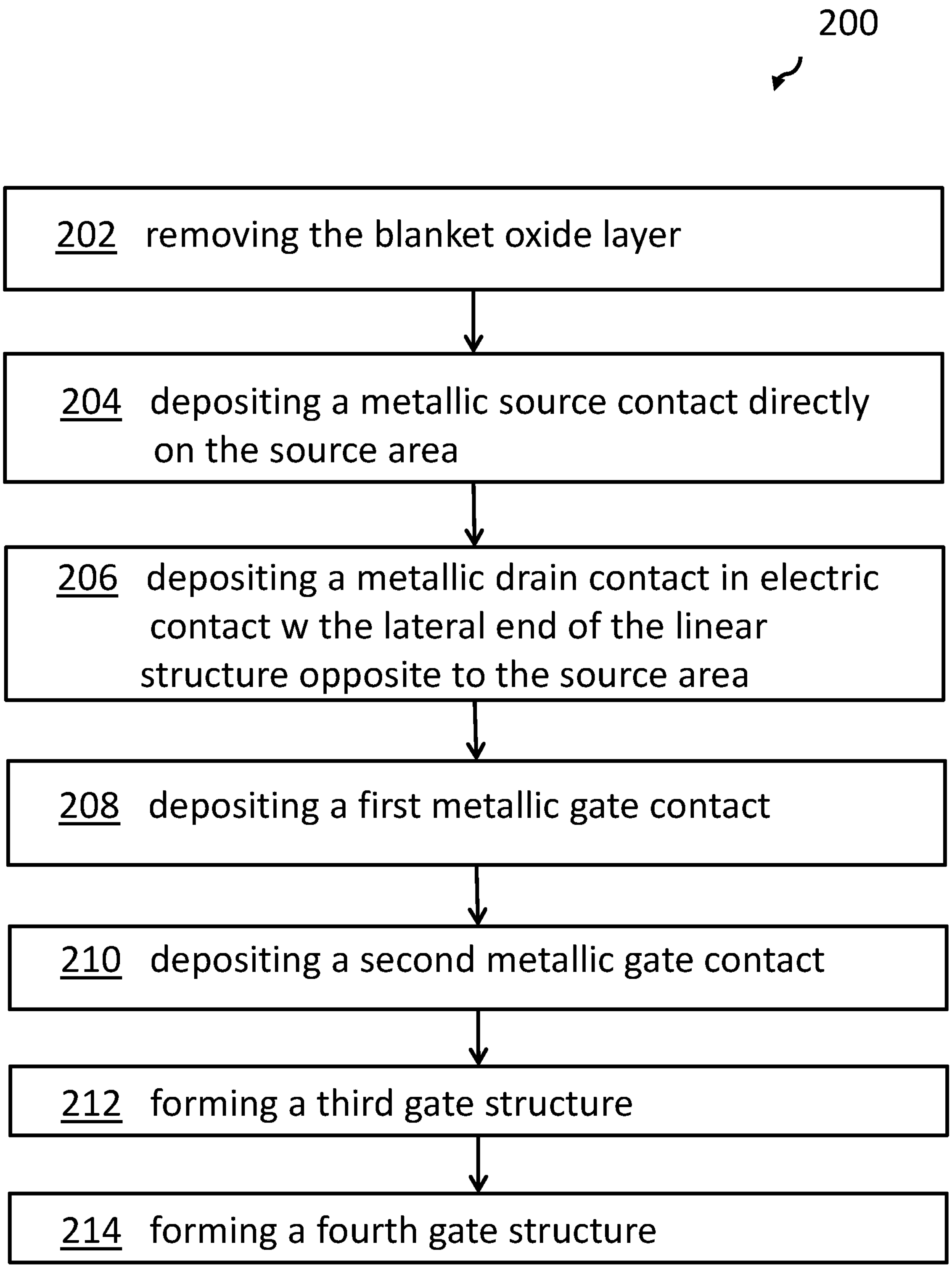

FIG. 2 shows a block diagram of a flowchart for method steps for alternative embodiments of the present invention.

Figure 3:
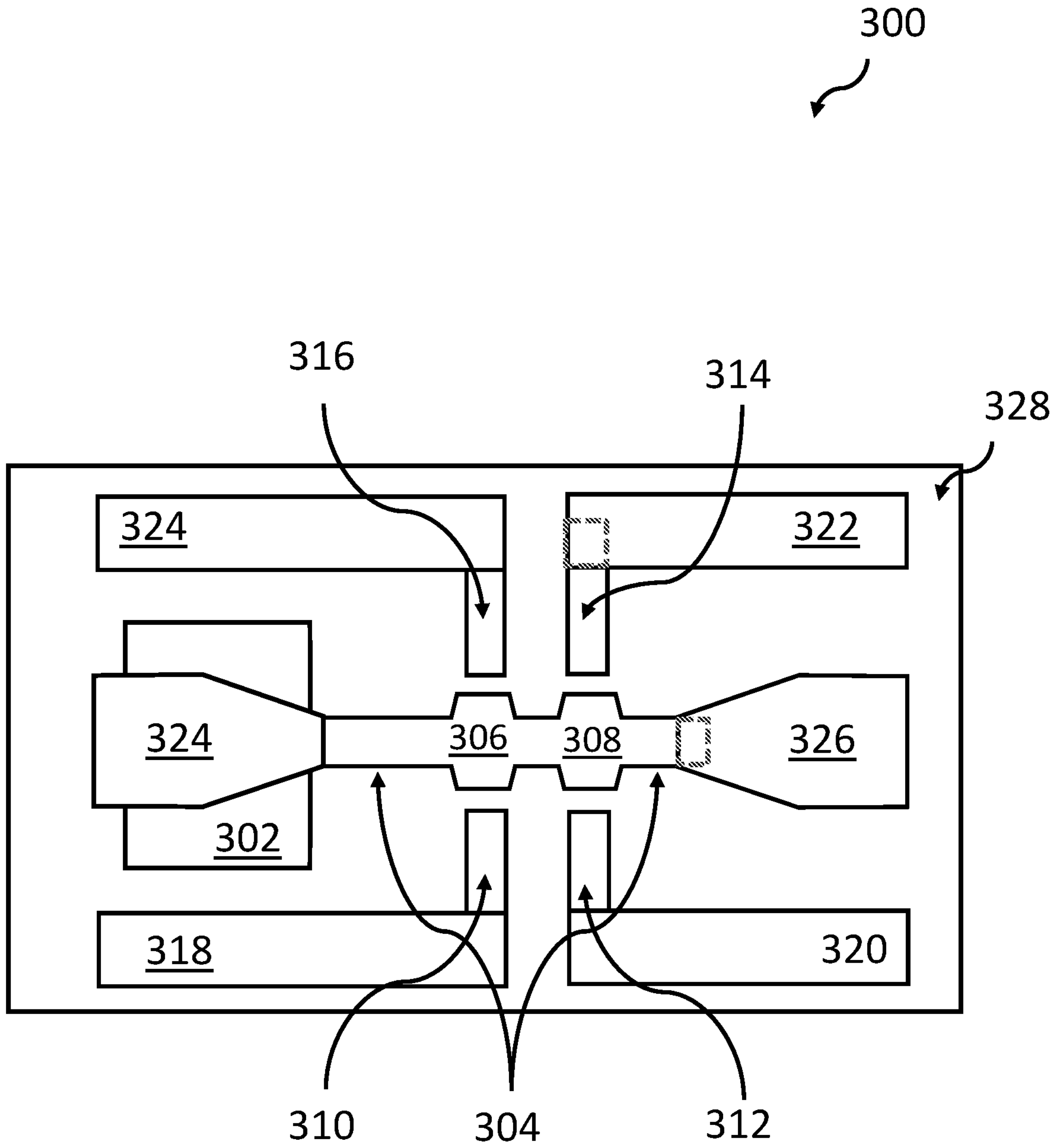

FIG. 3 shows a top view of the final device with the quantum dots and self-aligned gates, in accordance with an embodiment of the present invention.

Figure 4:
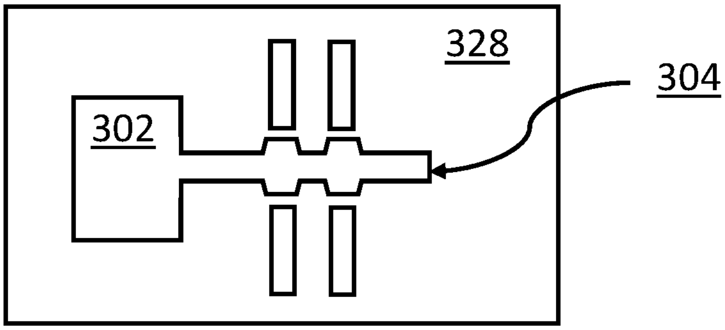

FIG. 4 shows the oxide surface with doped silicon structures, in accordance with an embodiment of the present invention.

Figure 5:
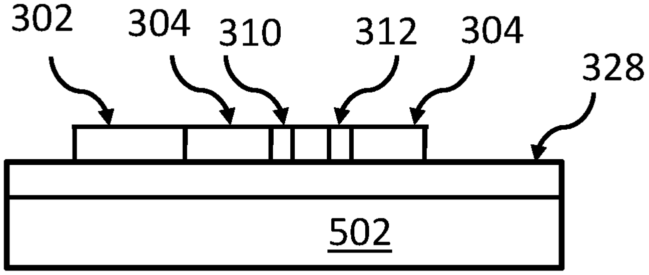

FIG. 5 shows a side view of the structures of FIG. 4, in accordance with an embodiment of the present invention.

Figure 6:
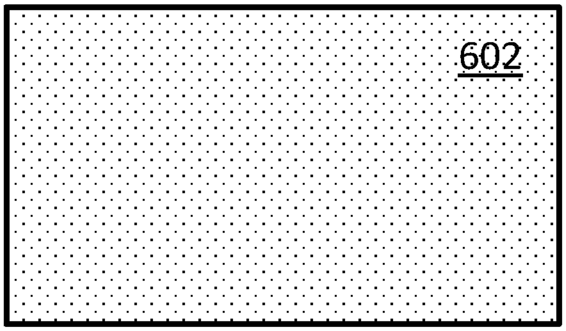

FIG. 6 shows the covering of the structures and the remaining surface of the oxide with a blanket oxide, in accordance with an embodiment of the present invention.

Figure 7:
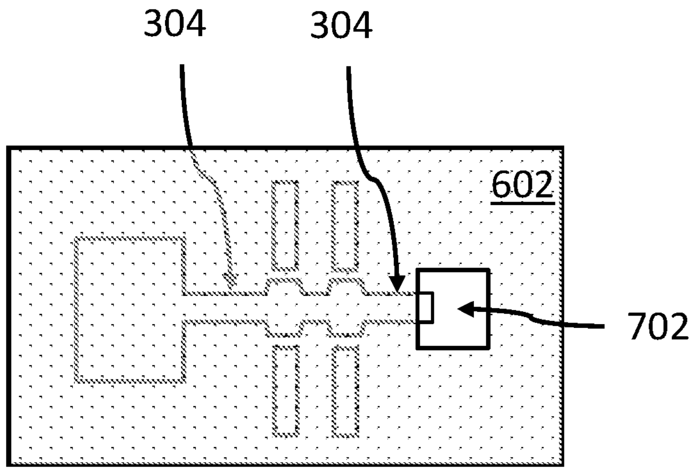

FIG. 7 shows that an opening is built into the blanket oxide at the end of the linear structure, in accordance with an embodiment of the present invention.

Figure 8:
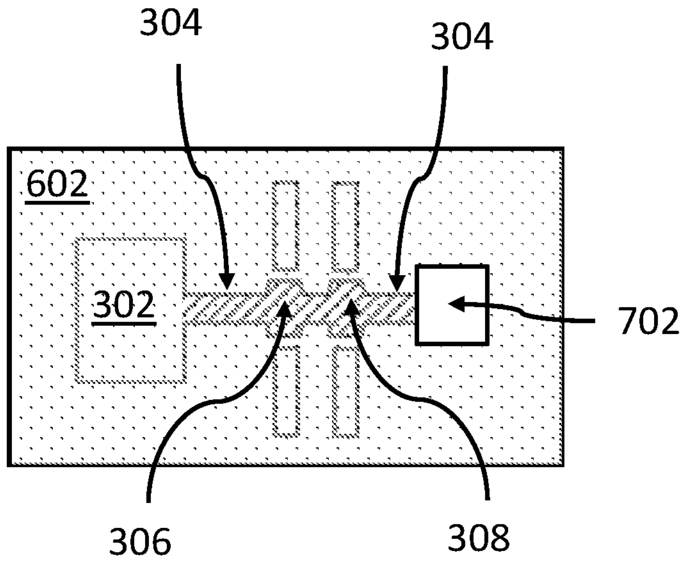

FIG. 8 shows how the linear structure including the broadened areas is etched back, in accordance with an embodiment of the present invention.

Figure 9:
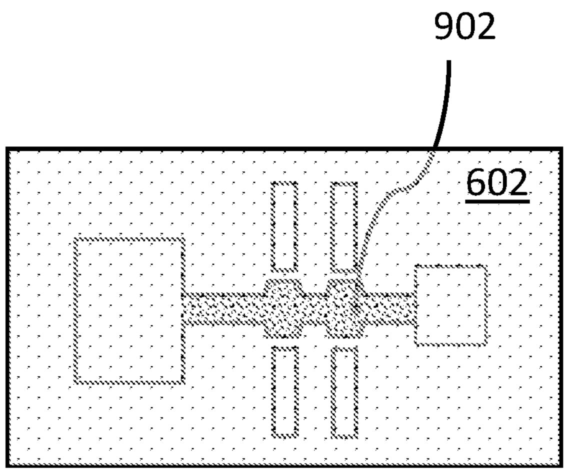

FIG. 9 shows a step in which the hollow template is re-grown with the material different to the doped silicon, in accordance with an embodiment of the present invention.

Figure 10:
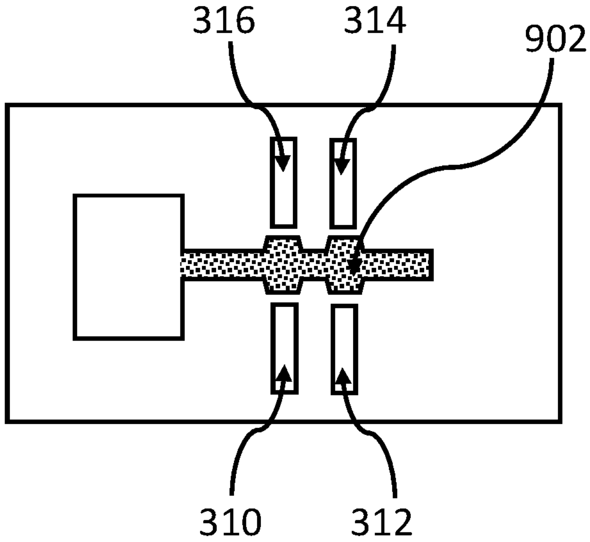

FIG. 10 shows that the blanket oxide has been removed, in accordance with an embodiment of the present invention.

Figure 11:
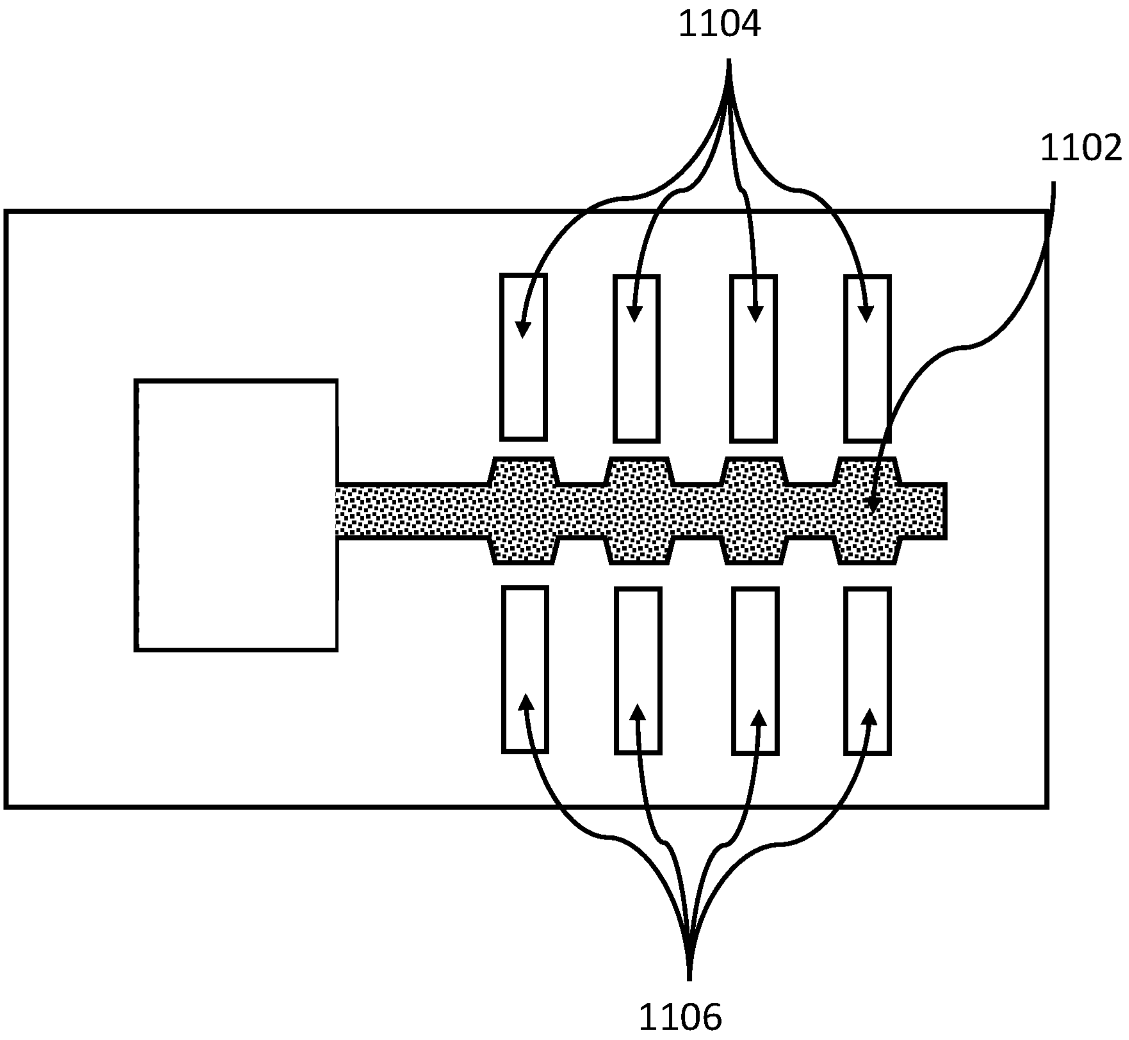

FIG. 11 shows another embodiment with an array of quantum dots, in accordance with an embodiment of the present invention.

DETAILED DESCRIPTION

In the context of this description, the following technical conventions, terms and/or expressions may be used:

The term ‘quantum dot’ may denote a nanoscopic material structure made of semiconductor material—e.g., SiGe or III-V semiconductors—comprising charge carriers that are constrained to free movement in all three spatial directions. As a consequence of the small structure, the energy of the charge carriers cannot be changed continuously but only in discrete steps. Hence, quantum dots behave in a comparable way to atoms; however, its form, size and number of electrons or charge carriers can be influenced. The energy levels for traditional quantum dots used for quantum devices may be defined by an electrostatic confinement. In the concept proposed here, this is not required. Instead, the confinement may be reached only via the geometry of the quantum dots.

The term ‘self-aligned gate structure’ may denote here a structure deposited on an oxide, where the gate structure, e.g., of doped Si, is perfectly aligned with a quantum dot. The gate structure may have been fabricated at the same time and in the same lithographic step the position of the quantum dot was defined. Since both entities may be produced in the same lithographic step, e.g., using the same mask, no mismatch can occur. This would be different, if the quantum dot and the gate structure would have been produced in different lithographic steps, i.e., using different photolithographic masks.

The term ‘linear structure’ may also be denoted as a one-dimensional structure. In this case, a thin layer of a semiconductor on an oxide. Thereby, the longitudinal dimension of the linear structure is much, much larger than in the other two dimensions vertical to the linear extension.

The term ‘distinct broadened area’—or simply ‘broadened area’—may denote an area of the linear structure that has a nearly round diameter which is about 1.5 times to 3 times larger than a width of the linear structure parallel to the underlying oxide support layer.

The term ‘blanket oxide layer’ may denote an oxide, e.g., $SiO_2$ or another dielectric covering all Si structure elements that have been lithographically fabricated out of a SOI base material.

The term ‘hollow template’ may denote a sort of tunnel or horizontal cavity below and in-between the blanket oxide layer and the supporting oxide layer.

Embodiments of the present invention recognize that quantum gates remain one of the challenging areas. Very low temperatures close to Absolute Zero are currently used and research is presently carried out on a large number of different realizations of quantum devices. Thereby, it is highly desirable to use existing fabrication techniques known in the field of classical chips, e.g., based on Silicon. In this field, metal-oxide-semiconductor feud-effect transistors (MOSFET) are the typical workhorses for a wide range of scalable electronic platforms. In the field of qubit devices, spin qubits are one of the most promising alternative qubits due to the potentially high scalability and attractive properties. They have the potential to evolve as the natural choice for physical quantum devices.

One of the key scalability challenges is that when the physical qubit is defined by geometry or a hetero-structure of semiconductor layers, to reduce the number of input lines to the physical qubit device, the necessary control gates must be placed in a process at where it is difficult to align the required physical structures. This has an impact on scalability, minimum device features and finally fabrication yield. This can be seen in the example of a basic implementation of the qubit device using nanowire/fin-type structures. A realistic device will likely need at least three additional gates to set the confinement potential in order to achieve discrete energy levels as well as additional read outlines. In particular, the comparatively high number of confinement and read-out gates for single devices is counterproductive for scalability to many thousand physical qubit devices.

Embodiments of the present invention provide a method for forming a semiconductor structure comprising quantum dots with self-aligned gate structures as well as the resulting quantum device may offer multiple advantages, technical effects, contributions and/or improvements:

The proposed embodiment for building a physical qubit device comprising coupled quantum dots may comprise a built-in, inherent alignment of gates that related to the quantum dots and the areas of the quantum dot itself. The here proposed concept also provides geometrically defined quantum dots as broadened area of a linear structure so that generally no gates are required to set the confinement potential. Instead, the available gates may be used to apply other control signals and for read-out purposes.

By the self-alignment of the quantum dots and the associated gates, scalability to a much larger number of coupled quantum dots may be achieved without limitations. This overcomes the so far existing challenge to position the gates in a separate lithographic step in relation to the—potentially electrostatically defined—quantum dots. Both challenges may be overcome with the concept proposed here. Hence, the requirement for at least three additional gates for at least two coupled quantum dots of a physical qubit device no longer applies since the quantum dots are defined geometrically using the same lithographic mask as for other structures of the quantum device. Hence, a scalability of up to many thousands of quantum devices is possible.

As a result, quantum dots can be packed densely in an array which provides high chances for highly interacting qubit devices. Furthermore, the typically 10 nm quantum dots with a 10 nm spacing (which is only limited by the lithography system) can easily be controlled by traditional semiconductor manufacturing techniques. Because of this, also quantum dot charge sensors can be integrated within the same lithography step and on the same base substrate. Hence, the proposed embodiment of the present invention represents a complete concept of simplifying an integration of traditional electronic components for control lines and read-out circuits for coupled quantum dots defining physical qubit devices.

In the following, additional embodiments of the present invention—applicable to the method as well as to the device—will be described.

According to a preferred embodiment, the method may also comprise removing the blanket oxide layer, and depositing a metallic source contact, e.g., directly on the source area. The blanket oxide layer may no longer be required after the device structures have been built up.

According to another preferred embodiment, the method may also comprise depositing a metallic drain contact in electrical contact with the lateral end of the linear structure opposite to the source area.

According to a third preferred embodiment, the method may also comprise depositing a first metallic gate contact over the isolator substrate—in particular, of the SOI foundation—where the first metallic gate contact is an electrical contact with the first gate structure and depositing a second metallic gate contact over the isolator substrate—in particular, of the SOI foundation—where the second metallic gate contact is an electrical contact with the second gate structure. In this way source, drain and gate contacts have been established, allowing the device to be electrically wired to other devices. Furthermore, each broadened area of the linear structure may be instrumented with two gates on opposite sides of the broadened area and preferably vertically to the linear structure. The device may thus be equipped with a plurality of gates, e.g., for optional confinement purposes but mainly for read-out purposes for the resulting physical quantum device.

According to a permissive embodiment of the method, the at least two distinct broadened areas have each a diameter which is in the range of about 1.5 to 3 times the second width. Hence, the diameter of the broadened area may be roughly twice as wide (up to 3 times) as the linear structure. Given a practically reachable width of the linear structure of about 3 nm, the broadened areas may have a diameter of up to 9 or 10 nm. Quantum dots of this size may establish a good geometric confinement so that no confinement gates may be required.

Hence and according to a useful embodiment of the method, the diameter of the broadened areas may be 10 to 30 nm. Optionally, the diameter may go down to 5 nm or even 3 nm.

According to an advantageous embodiment of the method the semiconductor material other than silicon—i.e., the material of the quantum dots—may be InAs, InSb, InGaAs and GaAs. Using III-V semiconductors for the forming of the quantum dots may have the advantage of higher carrier mobility, higher quantum dot charging energy and enable energy band structure engineering.

As already mentioned above and according to a further developed embodiment, the method may also comprise forming a third gate structure extending from an opposite side as the first gate structure of the first of the at least two distinct broadened areas and forming a fourth gate structure extending from an opposite side as the second one of the at least two distinct broadened areas. This may have been done during the initial structuring step when forming the first and second gate. Hence, also the third and fourth gates may also be self-aligned with the quantum dot in a nanometer range. This is because they may also be fabricated in the same single lithographic step to build the linear structure with the broadened areas. If more than two quantum dots—aka broadened areas—may be part of the linear structure, more gates may be fabricated in the same lithographic step without additional difficulties.

Hence and according to a further embodiment, the method may additionally comprise forming a plurality of distinct broadened areas—e.g., more than two, and more or less theoretically unlimited—as part of the linear structure and providing for each of the plurality of distinct broadened areas one or two aligned gates. This way, a more complex device structure may be achieved with a larger number of confinement gates and read-out gates for the multi-qubit quantum device.

According to another advantageous embodiment of the method, the plurality of distinct broadened areas may be equidistant. This may allow a good controllable coupling of the states between the quantum dots.

In the following, a detailed description of the figures will be given. All instructions in the figures are schematic. Firstly, a block diagram of an embodiment of the inventive method for forming a semiconductor structure comprising quantum dots with self-aligned gate structures is given. Afterwards, further embodiments, as well as embodiments of the structured semiconductor device comprising quantum dots with self-aligned gate structures defining a physical qubit will be described.

FIG. 1 shows a block diagram of a preferred embodiment of the method 100 for forming a semiconductor structure comprising quantum dots with self-aligned gate structures. The method 100 providing, 102, silicon-on-isolator (SOI) substrate comprising a doped silicon layer—e.g., doped with carriers in the range of $10^{19}$ per $cm^{-3}$—atop an isolator. The complete substrate can be a silicon wafer or substrate covered with an oxide and comprising an additional Si layer on top. Thus, the oxide may be denoted as BOX (Buried OXide).

The method 100 also comprises structuring, 104, the doped silicon layer—e.g., by a typical masking/lithography and etching process—to form the following structures simultaneously in the same, single lithographic step(s): (i) a source area, (ii) a linear structure—also denotable as one-dimensional—extending from the source area, where the linear structure has a first width which is smaller than a main area of the source area, and where the linear structure comprises at least two distinct broadened areas. These distinct broadened areas have each a second width which is larger—e.g., 1.5 to 3 times—than the first width of the linear structure.

The simultaneously prepared structures also comprise (iii) a first gate structure extending from a first one of the at least two distinct broadened areas, where the first gate structure is physically separated from any of the distinct broadened areas, and (iv) a second gate structure extending from a second one of the at least two distinct broadened areas—on the same or the other side if compared to the first gate, where the second gate structure is also physically separated from any of the distinct broadened areas, Furthermore, the method 100 also comprises covering, 106, the structures with a blanket oxide layer, in particular also between the broadened areas and the gate structures, forming, 108, a "growth" opening in the blanket oxide layer at a lateral end of the linear structure opposite to the source area, etching back, 110, semiconductor material of the linear structure and the at least two distinct broadened areas below the blanket oxide—in particular starting from the opening—until the source area is reached. Thereby, a hollow template between the isolator and the blanket oxide layer is formed, 112. Finally, the method 100 comprises filling, 114—in particular, epitaxially regrowing—the hollow template with a semiconductor material different to the silicon—e.g., III-V semiconductor—such that the at least two broadened areas are also filled up and build separated quantum dot areas which may in operation be coupled to each other. The confinement for carrier or other states—e.g., spin—in the quantum dots may be achieved only by the geometrical position and size. An additional electrostatic field to reach confinement may be superfluous. All gates may be used for read-out or other control purposes of the qubit devices.

FIG. 2 shows a block diagram of a flowchart for method steps for alternative or enhanced embodiments of the proposed concept. These method steps may comprise removing, 202, the blanket oxide layer, depositing, 204, a metallic source contact directly on the source area, —depositing, 206, a metallic drain contact in electrical contact with the lateral end of the linear structure opposite to the source area, depositing, 208, a first metallic gate contact over the isolator substrate, where the first metallic gate contact is in electrical contact with the first gate structure, and depositing, 210, a second metallic gate contact over the isolator substrate, where the second metallic gate contact is in electrical contact with the second gate structure.

Furthermore, method steps 200 for alternative embodiments can also comprise forming, 212, a third gate structure extending from an opposite side when compared to the first gate structure of the first one of the at least two distinct broadened areas, and forming, 214 a fourth gate structure extending from an opposite side as the second one of the at least two distinct broadened areas.

It should also be noted that the steps for alternative embodiments do not necessarily have to be executed in the described order. For example, the forming the third and the fourth gate (212, 214) may be performed at the same time at which the first and the second gate structure has been built, i.e., in the same lithographic step, so that also for these gates a self-alignment approach with the quantum dots can be achieved.

FIG. 3 shows a top view of the device 300 with the quantum dots 306, 308 and self-aligned gates 310, 312, 314 and 316. The gates—in particular, side-gates—are adjacent to the quantum dots 306 and 308. Again, these are broadened areas of the linear structure 304 which extends from the original doped Si mold 302. As can be seen, on top of the doped SI mold structure 302 a metal contact 324 overlaps with the linear structure 304. Gate contacts 318, 320, 322 and 324 can also be seen, which are in electrical contact with gates 310, 312, 314 and 316, respectively.

On the other side (in the figure on the right side), a drain contact 326 overlaps with the end of the linear structure 304. Furthermore, the gate contacts 318, 320, 322 and 324 can be recognized which are in electrical contact with the gates 310, 312, 314 and 316, respectively. This may be achieved by a partial overlap of the contacts and the gates, where the contacts overlap the respective gates. The complete structure or device is built on the surface of an oxide 328.

In a simpler form, only two of the four gates 310, 312, 314, and 316 may be realized, one for each quantum dot 306, 308. The gates may optionally be used for the confinement control of the quantum dots 306, 308 or—much more effectively—for read-out purposes of the physical qubit. Additionally, it is possible to also integrate read-out sensor electronics for the physical qubit device on/in the same surface 328. Because traditional semiconductor device technologies have been used for this quantum device, also other traditional electronic components may be fabricated using the same process structure in the same production line.

The following figures show the device fabrication method steps in more details, where it may be assumed that a template assisted selective epitaxy (known as TASE) process is used.

FIG. 4 shows the oxide surface 328 with the doped silicon structures: the seed doped Si structure 302, the linear structure 304 with the two broadened areas as well as for gates (without reference numeral). All structures have been built in the same single lithographic step. Hence, the broadened areas defining the position of the later built quantum dots and the gate structures originate from the same physical mask. Therefore, it is more or less impossible to misalign the gates with respective quantum dots. This allows precision control and the order of 1 nm of the gates relative to the quantum dots.

As mentioned before, the number of coupled quantum dots in the area can be scaled up freely why maintaining the self-alignment of the gates. As a further consequence, the quantum dots can be packed densely in the array which provides chances for high interactions between the quantum dots. Furthermore, define them and using this geometry approach rather than electrostatics allows to reduce the number of gates and thus control lines to the qubit chip.

FIG. 5 shows a side view of the structures of FIG. 4. Underlying the oxide 328, a silicon substrate 502 may be used. One may also recognize the gates 310 and 312 from the side as well as the linear structure 304 and the doped silicon mold area 302. It may be noted that all structures are elevated above the oxide 328.

FIG. 6 shows the covering of the structures and the remaining surface of the oxide 328 with a blanket oxide 602, shown as dotted area covering all structures and the respective surrounding of FIG. 4.

FIG. 7 shows that an opening 702 is built (e.g., using standard semiconductor process technology) into the blanket oxide 602 at the end 704 of the linear structure 304 until it reaches the oxide layer 328. From here—compare FIG. 8—the linear structure 304 including the broadened areas 306 and 308 is etched back until the seed Si area 302 is reached. Hence, a tunnel is built from the opening 702 under—and in between—the blanket oxide 602 and the bottom of the opening 702 which is the oxide 328 up to the seed Si area 302. This tunnel may also be denoted as hollow template for structures to be built into this tunnel.

FIG. 9 shows the next step of the method in which the hollow template is filled, i.e., re-grown, e.g., using a vapor epitaxy process with the material 902 different to the doped silicon, e.g., a III-V semiconductor. This may be a material 902 chosen from the group comprising InAs, InSb, InGaAs, and GaAs. However, also other II-VI or III-V semiconductors or e.g., Ge or GeSi may be suitable. Compared to silicon, such materials have different band gaps, different confinement potentials, different electron and hole effective masses. The vapor epitaxy process facilitates a crystal growth starting at the lateral surface of the silicon seed 302. It grants a high purity of the regrown semiconductor material and a good crystalline quality.

The next step, illustrated in FIG. 10, shows the final step of the proposed method, namely removing the blanket oxide 602 to uncover the Si area 602 as well as the gates and the linear structure 302 now comprising the quantum dots comprising, e.g., III-V semiconductor material 902. It may also be noted that the width of the linear structure can be in the range of about 10 to 30 nm. Other—in particular smaller sizes—are possible.

One or more additional process steps may comprise building the source contact, the drain contact as well as the gate contacts as already discussed in the context of FIG. 3. In this embodiment, traditional semiconductor production methods may be applied.

FIG. 11 shows another embodiment with an array of quantum dots, only one of which is shown with a reference numeral (1102), as well as a plurality of gates 1104 and 1106 which are all aligned with respective quantum dots 1102. The metallic contacts are not shown in the figure (compare FIG. 3)

The disclosed semiconductor structure device 300 can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried inter-connections). In any case the chip is then integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, a central processor or a quantum computer or parts of it.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

forming a semiconductor structure comprising quantum dots with self-aligned gate structures, wherein forming a semiconductor structure comprising quantum dots with self-aligned gate structure comprises:

providing silicon-on-isolator substrate comprising a doped silicon layer atop an isolator;

structuring said doped silicon layer to form one or more structures simultaneously, wherein the one or more structures comprise:

a source area, a linear structure extending from said source area, wherein said linear structure has a first width which is smaller than a main area of said source area, and wherein said linear structure comprises at least two distinct broadened areas, wherein said distinct broadened areas have each a second width which is larger than said first width of said linear structure, a first gate structure extending from a first one of said at least two distinct broadened areas, wherein said first gate structure is physically separated from any of said distinct broadened areas, and a second gate structure extending from a second one of said at least two distinct broadened areas, wherein said second gate structure is physically separated from any of said distinct broadened areas, wherein elements of said structured doped silicon layer are formed by a single lithography process, covering the structures with a blanket oxide layer;

forming an opening in the blanket oxide layer at a lateral end of the linear structure opposite to the source area;

etching back semiconductor material of said linear structure and said at least two distinct broadened areas below said blanket oxide until said source area is reached, thereby forming a hollow template between said isolator and said blanket oxide layer; and filling the hollow template with a semiconductor material different to the silicon such that the at least two broadened areas build quantum dot areas.

2. The method according to claim 1, further comprising:

removing said blanket oxide layer; and depositing a metallic source contact directly on said source area.

3. The method according to claim 2, further comprising:

depositing a metallic drain contact in electrical contact with said lateral end of said linear structure opposite to said source area.

4. The method according to claim 2, further comprising:

depositing a first metallic gate contact over said isolator substrate, wherein said first metallic gate contact is in electrical contact with said first gate structure; and depositing a second metallic gate contact over said isolator substrate, wherein said second metallic gate contact is in electrical contact with said second gate structure.

5. The method according to claim 1, wherein said at least two distinct broadened areas have each a diameter which is in said range of 1.5 to 3 times said second width.

6. The method according to claim 1, wherein said diameter of said broadened areas is 10 to 30 nm.

7. The method according to claim 1, wherein said semiconductor material different to said silicon is selected out of said group comprising InAs, InSb, InGaAs, and GaAs.

8. The method according to claim 1, further comprising:

forming a third gate structure extending from an opposite side as said first gate structure of said first one of said at least two distinct broadened areas; and forming a fourth gate structure extending from an opposite side as said second one of said at least two distinct broadened areas.

9. The method according to claim 1, further comprising:

forming a plurality of distinct broadened areas as part of said linear structure; and providing for each of said plurality of distinct broadened areas one or two aligned gates.

10. The method according to claim 9, wherein said plurality of distinct broadened areas are equidistant.

* * * * *